(12) United States Patent
Gleiter

(10) Patent No.: US 9,995,776 B2
(45) Date of Patent: Jun. 12, 2018

(54) METHOD AND DEVICE FOR ASCERTAINING AN INSULATION RESISTANCE, AND HIGH VOLTAGE BATTERY SYSTEM HAVING A DEVICE OF THIS TYPE

(71) Applicant: Robert Bosch GmbH, Stuttgart (DE)

(72) Inventor: Andreas Gleiter, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 6 days.

(21) Appl. No.: 15/304,564

(22) PCT Filed: Apr. 7, 2015

(86) PCT No.: PCT/EP2015/057494
§ 371 (c)(1),
(2) Date: Oct. 17, 2016

(87) PCT Pub. No.: WO2015/158569
PCT Pub. Date: Oct. 22, 2015

(65) Prior Publication Data
US 2017/0045562 A1    Feb. 16, 2017

(30) Foreign Application Priority Data

Apr. 17, 2014 (DE) .................. 10 2014 207 478

(51) Int. Cl.
*G01R 27/02* (2006.01)
*G01R 31/14* (2006.01)
*G01R 15/06* (2006.01)
*G01R 31/02* (2006.01)

(52) U.S. Cl.
CPC .......... *G01R 27/025* (2013.01); *G01R 15/06* (2013.01); *G01R 31/14* (2013.01); *G01R 31/025* (2013.01)

(58) Field of Classification Search
CPC .. G01R 27/025; G01R 31/006; G01R 31/025; G01R 31/12; G01R 31/14; G01R 15/06
See application file for complete search history.

(56) References Cited

U.S. PATENT DOCUMENTS 4,327,390 A * 4/1982 Despiney ............... G01R 15/06
324/126
2007/0132459 A1    6/2007 Yamamoto et al.
(Continued)

FOREIGN PATENT DOCUMENTS

CN    102944750    2/2013
DE    19648230    6/1998
(Continued)

OTHER PUBLICATIONS

International Search Report for Application No. PCT/EP2015/057494 dated Jun. 25, 2015 (English Translation, 3 pages).

*Primary Examiner* — Son Le
*Assistant Examiner* — Dustin Dickinson
(74) *Attorney, Agent, or Firm* — Michael Best & Friedrich LLP

(57) ABSTRACT

The invention relates to a method for ascertaining an insulation resistance (2) of a test object (3) to be examined, wherein a decoupling capacitor (4) having a first capacity, and a measuring capacitor (5) having a second capacity are connected in series with the test object (3) in such a way that the decoupling capacitor (4) and the measuring capacitor (5) form a low-pass with the insulation resistance (2) of the test object (3), wherein a predetermined voltage (9) is applied to the series connection, the measuring capacitor voltage (8) declining on the measuring capacitor (5) is ascertained, and, by means of an evaluation unit (7), considering the first capacity, the second capacity and the ascertained measuring capacitor voltage (8), the insulation resistance (2) of the test object (3) is determined. The invention also relates to a (Continued)

device (1) for ascertaining an insulation resistance (2) of a test object (3) to be examined, said device (1) having a circuit assembly, a measuring unit (6) and an evaluation unit (7). The invention further relates to a high-voltage battery system having a device (1) according to the invention for ascertaining an insulation resistance (2).

10 Claims, 2 Drawing Sheets

(56) References Cited

U.S. PATENT DOCUMENTS

| | | |
|---|---|---|
| 2009/0108850 A1 | 4/2009 | Yamagami et al. |
| 2009/0289640 A1 | 11/2009 | Kawamura et al. |
| 2010/0315096 A1 | 12/2010 | Yamamoto et al. |
| 2011/0080676 A1* | 4/2011 | Yoshida ............... G01R 31/025 361/30 |
| 2012/0286697 A1* | 11/2012 | Kimura .................. G05F 3/242 315/291 |
| 2013/0082684 A1 | 4/2013 | Spalding |
| 2013/0314097 A1 | 11/2013 | Hausberger et al. |
| 2014/0159747 A1* | 6/2014 | Frantz .................... G01N 27/60 324/679 |

FOREIGN PATENT DOCUMENTS

| | | | |
|---|---|---|---|
| DE | 10201204752 | * 11/2013 | ............. G01N 27/04 |
| EP | 2570289 | 3/2013 | |
| SU | 761939 | 9/1980 | |

* cited by examiner

METHOD AND DEVICE FOR ASCERTAINING AN INSULATION RESISTANCE, AND HIGH VOLTAGE BATTERY SYSTEM HAVING A DEVICE OF THIS TYPE

BACKGROUND OF THE INVENTION

The invention relates to a method for ascertaining an insulation resistance of a test object that is to be examined, wherein the test object, in particular, may be a high-voltage system or a component of a high-voltage system.

The invention furthermore relates to a device for ascertaining an insulation resistance of a test object that is to be examined, wherein the device has a circuit arrangement, a measuring unit and an evaluation unit.

In addition, the invention relates to a high-voltage battery system having a device for ascertaining an insulation resistance of the high-voltage battery system.

Unwanted electrical potential differences representing a potential danger can form in a high-voltage system due to insulation faults or due to a change in the insulation resistance, for example due to material ageing or material damage. On the one hand, the high-voltage system may be damaged, and, on the other hand, the danger of electric shocks exists for persons using or working on the high-voltage system.

A device is known from document EP 2 570 281 A1 for measuring the insulation resistance of a high-voltage battery system. In order to measure the insulation resistance, a reference resistance is provided which can be connected via switching elements in parallel with the insulation resistances that are to be ascertained. The high-voltage battery itself is used as a voltage source for ascertaining the insulation resistance.

In addition, a method is known from document CN 102 944 750 for measuring the insulation resistance of a device during the operation of the device.

In particular, the connection of a voltage divider consisting of high-impedance resistors is known for ascertaining the insulation resistance in high-voltage systems. In IT systems (IT: Isolé Terre [not connected to ground]), both potentials HV+ and HB− must be isolated from ground.

Resistive measurements used to determine insulation resistance have the disadvantage that the insulation resistance itself is negatively influenced by the resistive measurement. If a measurement of the insulation resistance is carried out by means of resistive measurements, an electrical connection is disadvantageously established via the resistors required for this purpose. In addition, relays are normally required for insulation resistance measurements of this type, such as, for example, in the document EP 2 570 289 A1, said relays being subject to wear.

Against this background, an object of the invention is to improve the measurement of the insulation resistance of a test object that is to be examined in such a way that the potentials HV+ and HV− remain electrically isolated from the vehicle ground when the insulation resistance is ascertained. In addition, a facility for ascertaining the insulation resistance which results in less wear is advantageously to be provided.

SUMMARY OF THE INVENTION

In order to achieve the object, a method is proposed for ascertaining an insulation resistance of a test object that is to be examined, wherein a decoupling capacitor having a first capacitance and a measuring capacitor having a second capacitance are connected to the test object to form a series circuit in such a way that the decoupling capacitor and the measuring capacitor, together with the insulation resistance of the test object, form a low-pass filter, wherein a predetermined voltage is applied to the series circuit, the measuring capacitor voltage dropping on the measuring capacitor is measured and the insulation resistance of the test object is determined by means of an evaluation unit, taking account of the first capacitance, the second capacitance and the measured measuring capacitor voltage. The decoupling capacitor advantageously serves to electrically decouple the potentials of the vehicle ground to HV+ and HV− of the high-voltage system of the test object. The measuring capacitor advantageously serves to measure the voltage drop.

An electrical isolation of the insulation monitoring is thus advantageously implemented by the invention.

According to a particularly preferred design of the method according to the invention, it is provided that an alternating current ("AC") voltage source which supplies an AC voltage at a predetermined frequency as the predetermined voltage is additionally connected in series with the measuring capacitor and the decoupling capacitor, wherein the insulation resistance of the test object is determined by means of the evaluation unit, taking additional account of the AC voltage and the frequency of the AC voltage.

It is provided in particular that the relation $$\frac{U_{CM}}{U_{ges}} = 1 \bigg/ \left(\frac{C_M}{C_K} + 1 - j\omega C_M R_{ISO}\right)$$

or resolved according to $R_{ISO}$:

$$R_{ISO} = \frac{1}{j\omega C_M}\left(\frac{U_{CM}}{U_{ges}} - 1 - \frac{C_M}{C_K}\right)$$

(in each case the amounts thereof.) is used to determine the insulation resistance, wherein the following applies:

$U_{CM}$ is the measuring capacitor voltage;
$U_{ges}$ is the voltage predetermined by the AC voltage source;
is the frequency of the AC voltage;
j is a complex (imaginary) unit;
$C_M$ is the capacitance of the measuring capacitor;
$C_K$ is the capacitance of the decoupling capacitor;
$R_{ISO}$ is the insulation resistance of the test object.

Since all quantities except for the insulation resistance $R_{ISO}$ are known, the insulation resistance is determinable or directly calculable by means of the evaluation unit.

An advantageous design variant of the method according to the invention provides that a switching element is additionally connected in series with the measuring capacitor and the decoupling capacitor, the switching element is closed, the time constant of the low-pass filter is determined by means of the evaluation unit from a change in the measuring capacitor voltage following the closure of the switching element and the insulation resistance of the test object is determined, taking additional account of the time constant. In this advantageous design variant, the AC voltage source is advantageously replaced by a switch, in particular a relay or a high-power MOSFET (MOSFET: Metal Oxide Semiconductor Field-Effect Transistor). The evaluation is then advantageously performed via the voltage increase, i.e. the time constant of the low-pass filter which the capacitors form together with the insulation resistance.

It is provided, in particular, that the relation $$\frac{U_{CM}}{U_{ges}} = \frac{C_{ges}}{C_M}\left(1 - e^{-\frac{t}{\tau}}\right)$$

is used here to determine the insulation resistance, wherein the following applies:

$U_{CM}$ is the measuring capacitor voltage;
$U_{ges}$ is the applied total voltage;
$C_{ges}$ is the total capacitance;
$C_M$ is the capacitance of the measuring capacitor;
is Euler's number;
t is time; and
is the time constant.

The following applies to the time constant:

$\tau = RC$ where
C is the total capacitance (series circuit comprising the first capacitance and the second capacitance and any other y-capacitances of the test object that are also present); and
R is the insulation resistance of the test object.

If no y-capacitances are to be taken into account, the following applies:

$$\frac{1}{C} = \frac{1}{C_M} + \frac{1}{C_E}$$

where
$C_M$ is the capacitance of the measuring capacitor; and
$C_E$ is the capacitance of the measuring capacitor.

Since all quantities except for the insulation resistance R are known, the insulation resistance is determinable by means of the evaluation unit.

A further advantageous design of the method according to the invention provides that the insulation resistance of the test object is determined by means of the evaluation unit, taking additional account of capacitances of the test object. Additional capacitances of the test object are present, in particular, due to Y-capacitors used in the high-voltage system which are used, in particular, as interference-suppression capacitors.

In order to achieve the aforementioned object, a device is furthermore proposed for ascertaining an insulation resistance of a test object that is to be examined, wherein the device has a circuit arrangement, a measuring unit and an evaluation unit, wherein the circuit arrangement comprises a series circuit comprising a decoupling capacitor with a first capacitance and a measuring capacitor with a second capacitance. The circuit arrangement is advantageously designed to be connected to the test object in such a way that the insulation resistance of the test object, together with the decoupling capacitor and the measuring capacitor, forms a low-pass filter. The measuring unit measures a measuring capacitor voltage dropping on the measuring capacitor. The evaluation unit is advantageously designed to determine the insulation resistance of the test object, taking account of the first capacitance, the second capacitance and the measuring capacitor voltage. It is provided, in particular, that the measuring unit is connected in parallel with the measuring capacitor in order to measure the measuring capacitor voltage.

According to one particularly preferred design of the device according to the invention, the circuit arrangement comprises an AC voltage source which is connected in series with the decoupling capacitor and the measuring capacitor and is designed to supply a predetermined AC voltage at a predetermined frequency. The evaluation unit is advantageously designed to determine the insulation resistance of the test object, taking additional account of the predetermined AC voltage and the predetermined frequency. It is provided, in particular, that the AC voltage source supplies an AC voltage at a frequency in the order of magnitude of $10^4$ Hz to $10^6$ Hz (Hz: hertz), preferably a frequency of around 100 kHz (kHz: kilohertz).

According to one particularly advantageous design variant of the device according to the invention, it is provided that the circuit arrangement comprises a switching element which is electrically connected in series with the decoupling capacitor and the measuring capacitor, wherein the evaluation unit is advantageously designed to determine the time constant of the low-pass filter formed by a connection of the circuit arrangement to the test object, taking additional account of a change in the measuring capacitor voltage following the closure of the switching element, and to determine the insulation resistance of the test object, taking additional account of the time constant. In this advantageous design variant, the switching element advantageously replaces the AC voltage source. A voltage supplied by the high-voltage system of the test object is advantageously used as the test voltage source.

According to one advantageous further design of the device according to the invention, the value of the first capacitance of the decoupling capacitor corresponds to 0.3 to 0.7 times the value of the second capacitance of the measuring capacitor. According to one advantageous design, it is provided, in particular, that the decoupling capacitor has a capacitance of 22 nF (nF: nanofarad) and the measuring capacitor has a capacitance of 47 nF.

It is provided, in particular, that the order of magnitude of the value of the first capacitance of the decoupling capacitor and/or the value of the second capacitance of the measuring capacitor is between $10^{-9}$ F and $10^{-6}$ F (F: farad), i.e. between 1 nF and 1 μF.

In order to achieve the aforementioned object, a high-voltage battery system, in particular a traction battery, with a device for ascertaining an insulation resistance is additionally provided, wherein the device is designed as a device according to the invention for ascertaining an insulation resistance.

BRIEF DESCRIPTION OF THE DRAWINGS

Further advantageous particulars, features and design details of the invention are explained further in connection with the example embodiment shown in the figures, wherein.

DETAILED DESCRIPTION

Figure 1:
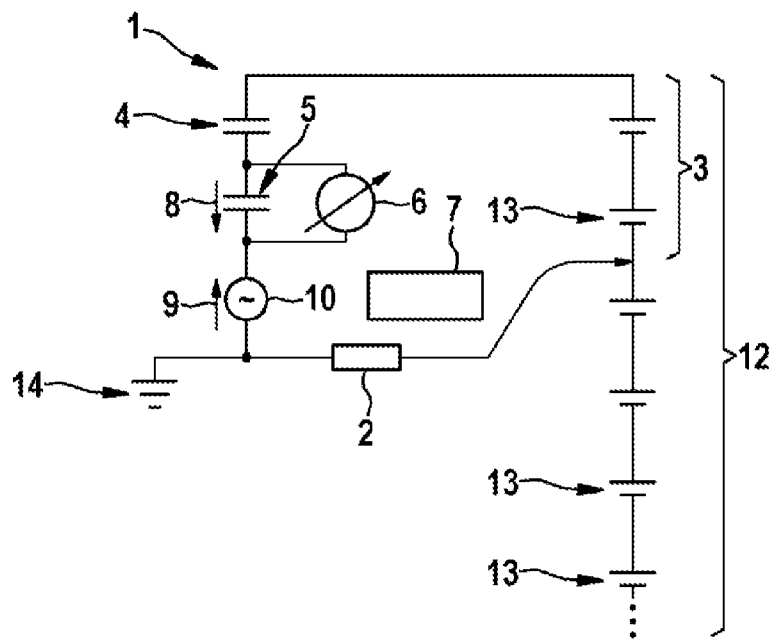
FIG. 1 shows, in a simplified representation, a circuit diagram of an example embodiment of a device according to the invention for ascertaining an insulation resistance of a test object that is to be examined.

FIG. 1 shows an example embodiment of a device 1 for ascertaining an insulation resistance of a test object 3 that is to be examined. The test object 3 is part of a high-voltage battery system 12. The insulation resistance of the test object 3 is shown in FIG. 1 as the resistance 2.

The device 1 shown in FIG. 1 comprises a circuit arrangement consisting of a series circuit formed from a decoupling capacitor 4, a measuring capacitor 5 and an AC voltage source 10. In addition, the device 1 comprises a measuring unit 6 to measure a measuring capacitor voltage 8 dropping on the measuring capacitor 5. The circuit arrangement consisting of the decoupling capacitor 4, the measuring capacitor 5 and the AC voltage source 10 is connected to the test object 3 in such a way that the insulation resistance 2 of the test object 3, together with the decoupling capacitor 4 and the measuring capacitor 5, forms a low-pass filter. The circuit arrangement is furthermore connected to the ground potential 14.

The device 1 furthermore comprises an evaluation unit 7 which is designed to determine the insulation resistance 2 of the test object 3. Use is made here of the fact that the AC voltage 10 specifies a predetermined AC voltage at a predetermined frequency. These known quantities, along with the known capacitances of the decoupling capacitor 4 and the measuring capacitor 5, and also the measured measuring capacitor voltage 8, are taken into account in ascertaining the insulation resistance.

The insulation resistance R is determined from the relation already mentioned above:

$$\frac{U_{CM}}{U_{ges}} = 1 \bigg/ \left(\frac{C_M}{C_K} + 1 - j\omega C_M R_{ISO}\right)$$

where $$R_{ISO} = \frac{1}{j\omega C_M}\left(\frac{U_{CM}}{U_{ges}} - 1 - \frac{C_M}{C_K}\right)$$

wherein the amounts thereof are in each case to form the basis.

$$\frac{U_{CM}}{U_{ges}}$$

describes the relative voltage drop on the measuring capacitor 5.

The evaluation unit is advantageously designed in such a way that the corresponding quantities form the basis for determining the insulation resistance R, or the values of the measured measuring capacitor voltage 8 can be transmitted to the evaluation unit 7. It is provided, in particular, that the evaluation unit 7 is a microcontroller circuit.

It is provided, in particular, that the decoupling capacitor 4 has a capacitance of 22 nF. The measuring capacitor 5 preferably has a capacitance of 47 nF. The AC voltage source preferably supplies a voltage at a frequency of 100 kHz. This dimensioning produces the relation shown in FIG. 2 between the relative voltage drop on the measuring capacitor 5 depending on the insulation resistance 2.

Figure 2:
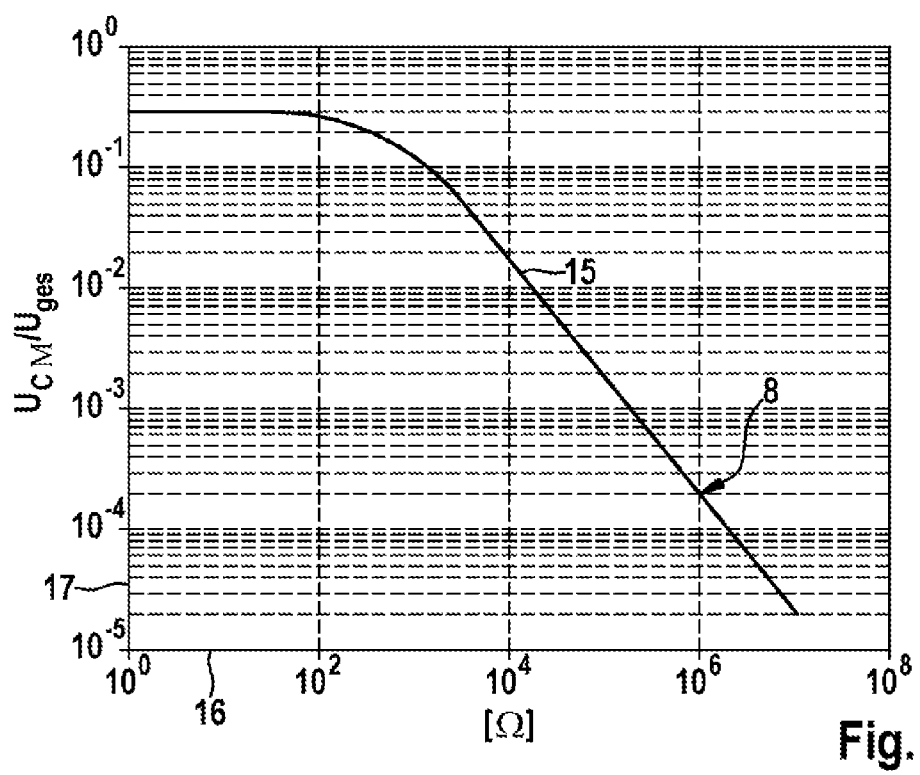
FIG. 2 shows an example of a relative voltage drop on the measuring capacitor depending on the insulation resistance.

FIG. 2 shows the associated relative voltage drop as a voltage curve 15 over the axis 16, representing the amount of the insulation resistance 2, and the axis 17, representing the ratio of the measuring capacitor voltage to the predetermined voltage.

For example, a ratio of the measuring capacitor voltage to the predetermined voltage of $2 \times 10^{-4}$ produces an insulation resistance of $10^6$ ohm, as can be read from point 18 in FIG. 2.

Figure 3:
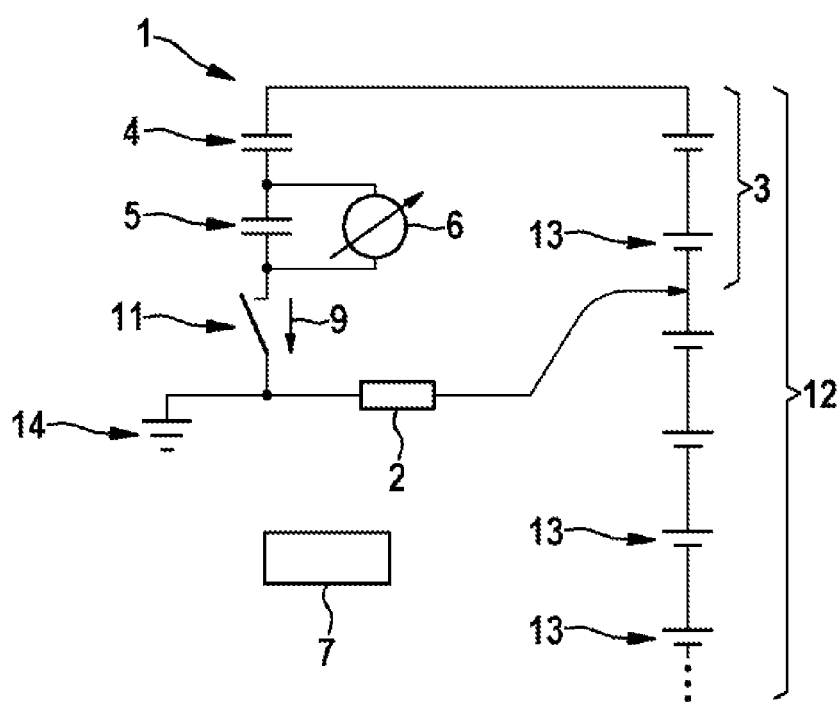
FIG. 3 shows, in a simplified representation, a circuit diagram of a further example embodiment of a device according to the invention for ascertaining an insulation resistance of a test object that is to be examined.

FIG. 3 shows a further example embodiment of a device 1 for ascertaining an insulation resistance of a test object 3 that is to be examined. In contrast to the device shown in FIG. 1, the device 1 shown in FIG. 3 has a switching element 11 instead of the AC voltage source 10. Through the battery cells 13 of the test object 3 of the high-voltage battery 12, a predetermined voltage 9 drops over the switching element. If the switching element 11 is closed, the relation already mentioned above:

$$\frac{U_{CM}}{U_{ges}} = \frac{C_{ges}}{C_M}\left(1 - e^{-\frac{t}{\tau}}\right)$$

applies accordingly, wherein the evaluation unit 7 of the device 1 is designed to ascertain the time constant τ of the low-pass filter formed by the decoupling capacitor 4, the measuring capacitor 5, and the insulation resistance 2, taking account of the change in the measuring capacitor voltage following the closure of the switching element 11. This means that the voltage increase on the measuring capacitor 5 is used to determine the insulation resistance R. The insulation resistance 2 is then determined from the ascertained time constant τ and the known capacitances of the decoupling capacitor 4 and the measuring capacitor 5 as $$R = \frac{\tau}{C}$$

wherein $$\frac{1}{C} = \frac{1}{C_M} + \frac{1}{C_E}$$

where $C_M$ is the capacitance of the measuring capacitor; and
$C_E$ is the capacitance of the decoupling capacitor.

In particular, it is provided as an advantageous design of the invention that the device 1 is a component of a high-voltage battery system 12. By means of a corresponding controllable connection of the device to a specifiable test object, it can advantageously be determined how many battery cells 13 are allocated to the test object 3.

The example embodiments shown in the figures and explained in connection therewith serve to explain the invention and are not restricting therefor.

The invention claimed is:

1. A method for ascertaining an insulation resistance (2) of a test object (3) that is to be examined, the method comprising: connecting a decoupling capacitor (4) having a first capacitance and a measuring capacitor (5) having a second capacitance to the test object (3) to form a series circuit in such a way that the decoupling capacitor (4) and the measuring capacitor (5), together with the insulation resistance (2) of the test object (3), form a low-pass filter, applying a predetermined voltage (9) to the series circuit, measuring a voltage drop (8) across the measuring capacitor, and determining the insulation resistance (2) of the test object (3) by means of an evaluation unit (7), taking account of the first capacitance, the second capacitance and the measured voltage drop (8).

2. The method as claimed in claim 1, wherein an alternating current (AC) voltage source (10) which supplies an AC voltage at a predetermined frequency as the predetermined voltage (9) is connected in series with the measuring capacitor (5) and the decoupling capacitor (4), wherein the insulation resistance (2) of the test object (3) is determined by means of the evaluation unit (7), taking additional account of the AC voltage and the frequency of the AC voltage.

3. The method as claimed in claim 1, wherein a switching element (11) is additionally connected in series with the measuring capacitor (5) and the decoupling capacitor (4), the switching element (11) is closed, the time constant of the low-pass filter is determined by means of the evaluation unit (7) from a change in the measuring capacitor voltage (8) following the closure of the switching element (11), and the insulation resistance (2) of the test object (3) is determined taking additional account of the time constant.

4. The method as claimed in claim 1, wherein the insulation resistance (2) of the test object (3) is determined by means of the evaluation unit (7), taking additional account of capacitances of the test object (3).

5. A device (1) for ascertaining an insulation resistance (2) of a test object (3) that is to be examined, wherein the device (1) has a circuit arrangement, a measuring unit (6) and an evaluation unit (7), wherein the circuit arrangement consists of a series circuit comprising a decoupling capacitor (4) with a first capacitance and a measuring capacitor (5) with a second capacitance, wherein the circuit arrangement is designed to be connected to the test object (3) in such a way that the insulation resistance (2) of the test object (3), together with the decoupling capacitor (4) and the measuring capacitor (5), forms a low-pass filter, the measuring unit (6) measures a measuring capacitor voltage (8) dropping on the measuring capacitor (5), and the evaluation unit (7) is designed to determine the insulation resistance (2) of the test object (3), taking account of the first capacitance, the second capacitance and the measuring capacitor voltage (8).

6. The device (1) as claimed in claim 5, wherein the circuit arrangement comprises an alternating (AC) voltage source (10) which is connected in series with the decoupling capacitor (4) and the measuring capacitor (5) and is designed to supply a predetermined AC voltage at a predetermined frequency, wherein the evaluation unit (7) is designed to determine the insulation resistance (2) of the test object (3), taking additional account of the predetermined AC voltage and the predetermined frequency.

7. The device (1) as claimed in claim 5, wherein the circuit arrangement comprises a switching element (11) which is electrically connected in series with the decoupling capacitor (4) and the measuring capacitor (5), wherein the evaluation unit (7) is designed to determine the time constant of the low-pass filter formed by a connection of the circuit arrangement to the test object (3), taking additional account of a change in the measuring capacitor voltage (8) following the closure of the switching element (11), and to determine the insulation resistance (2) of the test object (3), taking additional account of the time constant.

8. The device (1) as claimed in claim 5, wherein the value of the first capacitance of the decoupling capacitor (4) corresponds to 0.3 to 0.7 times the value of the second capacitance of the measuring capacitor (5).

9. The device (1) as claimed in claim 5, wherein the order of magnitude of the value of the first capacitance of the decoupling capacitor (4), the value of the second capacitance of the measuring capacitor (5), or both are between $10^{-9}$ F and $10^{-6}$ F.

10. A high-voltage battery system with a device (1) for ascertaining an insulation resistance (2), wherein the device (1) comprises: a decoupling capacitor (4) having a first capacitance and configured to be connected to a test object, a measuring capacitor (5) having a second capacitance and configured to be connected to the test object (3) to form a series circuit in such a way that the decoupling capacitor (4) and the measuring capacitor (5), together with the insulation resistance (2) of the test object (3), form a low-pass filter, a voltage source configured to apply a predetermined voltage (9) to the series circuit, a measuring unit to measure a voltage drop (8) across the measuring capacitor, and an evaluation unit to determine the insulation resistance (2) of the test object (3) by taking account of the first capacitance, the second capacitance and the measured voltage drop (8).

* * * * *